United States Patent
Scholz et al.

(10) Patent No.: US 9,192,080 B2
(45) Date of Patent: Nov. 17, 2015

(54) COMB-STRUCTURED SHIELDING LAYER AND WIRELESS CHARGING TRANSMITTER THEREOF

(71) Applicants: Frank Scholz, Berlin (DE); Stefan Graf, Buseck-Beuern (DE); Andre Waldschmidt, Hsinchu (TW); Lars Lindenstruth, Wetzlar (DE); Marco Jung, Hsinchu (TW)

(72) Inventors: Frank Scholz, Berlin (DE); Stefan Graf, Buseck-Beuern (DE); Andre Waldschmidt, Hsinchu (TW); Lars Lindenstruth, Wetzlar (DE); Marco Jung, Hsinchu (TW)

(73) Assignees: Lite-On Technology Corporation, Taipei (TW); Novero Dabendorf GmbH, Zossen (DE)

( * ) Notice: Subject to any disclaimer, the term of this patent is extended or adjusted under 35 U.S.C. 154(b) by 410 days.

(21) Appl. No.: 13/685,713

(22) Filed: Nov. 27, 2012

(65) Prior Publication Data
US 2013/0257366 A1    Oct. 3, 2013

Related U.S. Application Data

(60) Provisional application No. 61/619,427, filed on Apr. 3, 2012.

(51) Int. Cl.
| | |
|---|---|
| *H01M 10/46* | (2006.01) |
| *H05K 9/00* | (2006.01) |
| *H02J 7/02* | (2006.01) |
| *H02J 7/00* | (2006.01) |
| *H01F 27/36* | (2006.01) |

(52) U.S. Cl.
CPC ............ *H05K 9/00* (2013.01); *H01F 27/362* (2013.01); *H02J 7/0027* (2013.01); *H02J 7/0042* (2013.01); *H02J 7/025* (2013.01)

(58) Field of Classification Search
CPC .......... H02J 5/005; H02J 7/0045; H02J 7/025
USPC ............... 320/107, 108, 114; 336/84 R, 84 M
See application file for complete search history.

(56) References Cited

U.S. PATENT DOCUMENTS

| | | | | |
|---|---|---|---|---|
| 2009/0124294 | A1* | 5/2009 | Kim et al. | 455/566 |
| 2009/0250262 | A1* | 10/2009 | Jin | 174/384 |
| 2012/0112552 | A1* | 5/2012 | Baarman et al. | 307/104 |
| 2014/0070763 | A1* | 3/2014 | Chiles et al. | 320/108 |

FOREIGN PATENT DOCUMENTS

| | | |
|---|---|---|
| CN | 101983427 | 3/2011 |
| WO | 2012040548 | 3/2012 |

OTHER PUBLICATIONS

"Office Action of China Counterpart Application", issued on Jul. 27, 2015, p1-p6.

\* cited by examiner

*Primary Examiner* — Edward Tso
(74) *Attorney, Agent, or Firm* — Jianq Chyun IP Office (57) ABSTRACT

A comb-structured shielding layer and a wireless charging transmitter thereof are provided. The wireless charging module is connected to a power source, has at least one wireless charging coil and at least one comb-structured shielding layer, and is configured to convert alternative current power from the power source to H-field electromagnetic radiations, and wirelessly charges an electronic device. The comb-structured shielding layer is disposed between the wireless charging module and the target electronic device and configured to allow the H-field electromagnetic radiations pass through. The comb-structured shielding layer includes a first area and a second area. The first area is electrically connected to a reference electric potential. The second area is electrically connected to the reference electric potential through the first area, and is configured to shield the E-field electromagnetic radiations but allow the H-field electromagnetic radiations pass through the comb-structured shielding layer.

15 Claims, 9 Drawing Sheets

COMB-STRUCTURED SHIELDING LAYER AND WIRELESS CHARGING TRANSMITTER THEREOF

CROSS-REFERENCE TO RELATED APPLICATION

This application claims the priority benefits of U.S. provisional application Ser. No. 61/619,427, filed on Apr. 3, 2012. The entirety of the above-mentioned patent application is hereby incorporated by reference herein and made a part of this specification.

BACKGROUND

1. Technical Field

This invention relates to a comb-structured shielding layer, and, particularly, relates to a wireless charging transmitter which has the comb-structured shielding layer disposed on at least one side of the wireless charging transmitter.

2. Related Art

The vehicle in the future may have a great amount of electronic guidance, which may help and control the vehicle. The additional sensors, actuators and wires disposed in the vehicle may greatly increase weight of the vehicle. This situation seems contradictory to fuel consumption reduction efforts. In order to avoid adding such weight to the vehicle, these electrical or electronic components/systems may rely more on wirelessly transmitting information between them. These wireless communicating devices in the vehicle may not come in a consolidated and organized manner. These wireless communicating devices may come step by step depending on the technology progress and the vendors designing the electrical or electronic components/systems. The wireless transmission generally involves with electromagnetic radiation which usually occur in a non-directed fashion, hence such electromagnetic radiation may probably interfere with/influence other electrical or electronic components/systems. Such interference may lead to a higher risk in operation failures or even leading to safety issue. Thus, the automotive industry manufacturers such as original equipment manufacturers (OEM) have set high and strict standards in EMC and EMI compliance.

On the other hand, wireless charging of portable electronic devices will become a common feature in the vehicles in future. The wireless charging technology in general charges the electronic devices by magnetic induction caused by quick alternating currents in the transmitter coils of the wireless charging transmitter (or module).

During the wireless charging process, the magnetic H-fields that charge the device only interfere in a limited very small distance with other electronic devices which is acceptable by the OEM's, but the H-Fields do generate an E-Fields. The E-Fields do radiate in frequencies and amplitudes that are not compliant to OEM's EMC and EMI specifications; and thus the E-Fields may interfere with other in-vehicle electronics and may lead to safety problem. The aforementioned problems may occur also in other areas outside the vehicle. A simple metal shielding sheet such as being provided on printed circuit (PCB)s, e.g., radios or automotive multimedia playback modules will not work properly because the metal shielding sheet prevents transmitter coils of the wireless charging transmitter from being inductive magnetic coupling to the electronic device which needs to be charged.

SUMMARY

The invention is directed to a comb-structured shielding layer, which allows the H-field being radiated from the a wireless charging transmitter disposed below the comb-structured shielding layer, but shields the E-fields generated from the H-field. With the comb-structured shielding layer disposed on at least one side of the wireless charging transmitter, the wireless charging transmitter can wirelessly charge a target electronic device and meanwhile keep undesired E-field radiation lower than the predetermined threshold.

According to an embodiment of the invention, a comb-structured shielding layer is provided. The comb-structured shielding layer includes a first area and a second area. The first area is electrically connected to a reference electric potential. Additionally, the second area is electrically connected to the reference electric potential through the first area, being a comb-shape area, and configured to shield E-field electromagnetic radiations but allow magnetic H-field electromagnetic radiations associated with the E-field electromagnetic radiations pass through the comb-structured shielding layer.

According to an embodiment of the invention, a wireless charging transmitter is provided. The wireless charging transmitter includes a wireless charging module and at least one comb-structured shielding layer. The wireless charging module is connected to an external power source and has at least one wireless charging coil. The wireless charging module is configured to convert alternative current power from the external power source to magnetic H-field electromagnetic radiations, and wirelessly charges a target electronic device. Additionally, the at least one comb-structured shielding layer is disposed between the wireless charging module and the target electronic device, and configured to allow the magnetic H-field electromagnetic radiations pass through the at least one comb-structured shielding layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

It is to be understood that the terminology used herein is for the purpose of describing particular embodiments, and is not intended to be limiting, as the scope of the disclosure will be defined by the appended claims and equivalents thereof.

The singular forms "a," "an," and "the" include plural referents unless the context clearly dictates otherwise.

Figure 1:
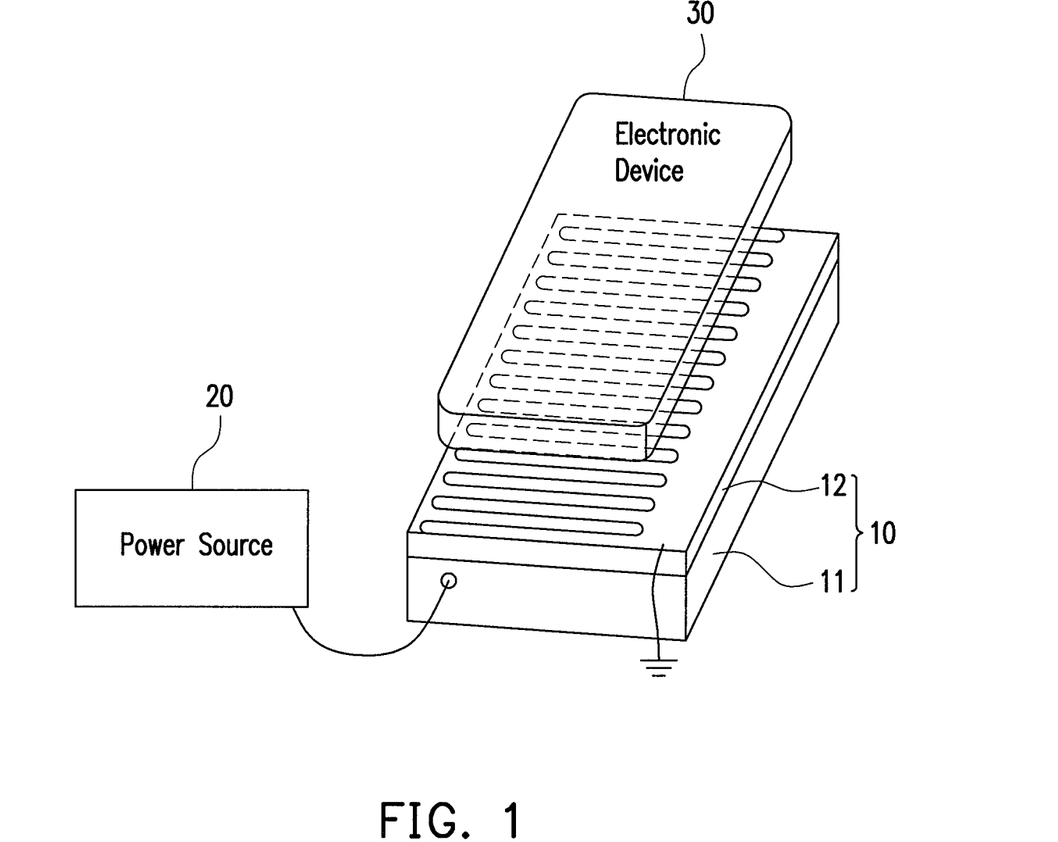
FIG. 1 is a schematic diagram illustrating a wireless charging transmitter with a comb-structured shielding layer according to an embodiment of the disclosure.

FIG. 1 is a schematic diagram illustrating a wireless charging transmitter with a comb-structured shielding layer according to an embodiment of the disclosure. Referring to FIG. 1, the wireless charging transmitter 10 includes a wireless charging module 11 and a shielding layer 12. The wireless charging module 11 is electrically coupled to a power source 20, which may provide alternating current (AC) power to the wireless charging module 11. The wireless charging module 11 has wireless charging coil structure (not shown in FIG. 1) which is configured to convert the AC power from the power source 20 to magnetic H-field radiation, which may be further configured to wirelessly charge an electronic device 30's battery which may be temporarily placed by a user on the top of the shielding layer 12. Also, the wireless charging module 11 may have ferritic encapsulation that provides an H-field and E-field shielding on different side(s) of the wireless charging module 11 in relation to the shielding layer 12. For example, in FIG. 1, the ferritic encapsulation is disposed on the bottom of the wireless charging module 11.

In the present embodiment, the shielding layer 12 is allocated on the top of the wireless charging module 11, and is configured to shield E-field radiations from the wireless charging module 11. The shielding layer 12 is a comb-structured shielding layer, which includes a striped area in which there are parallel spaces between its segments, and the segments altogether resemble a comb-shaped area. It is noted that, in the present disclosure, a wireless charging coil structure/charging coil of the wireless charging module 11 is completely covered by the comb-shaped area of the comb-structured shielding layer 12.

Figure 2:
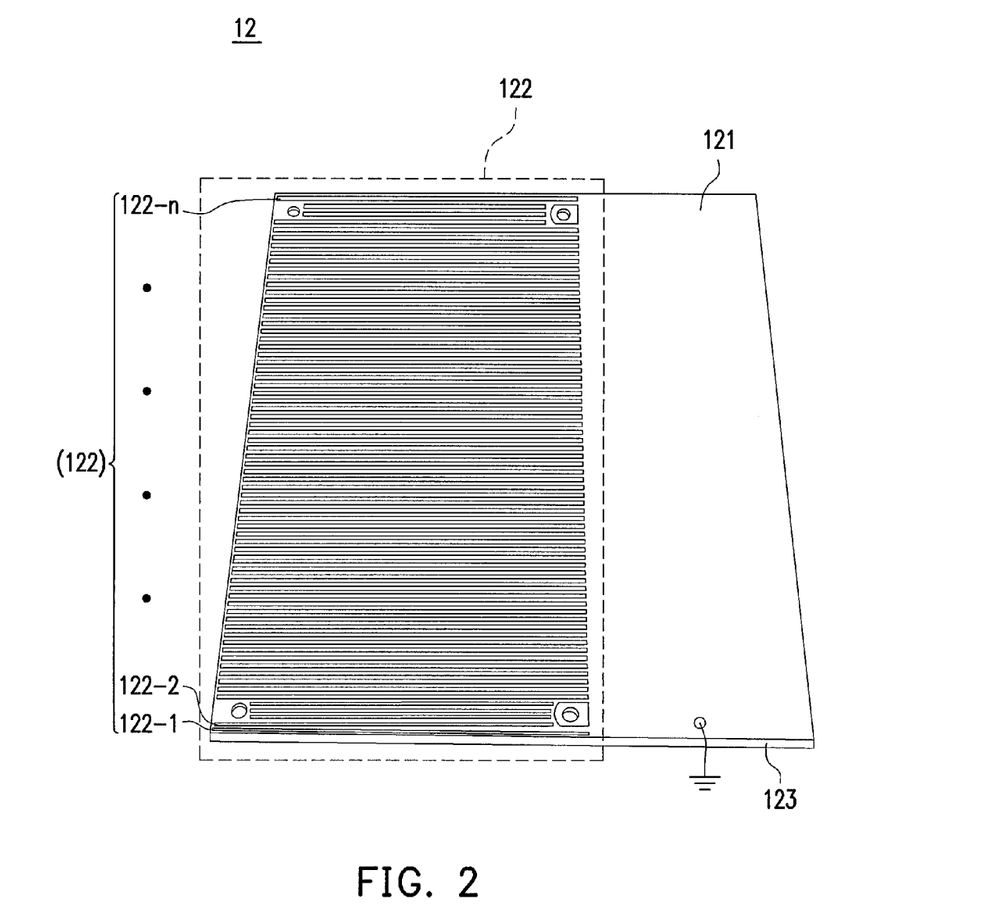
FIG. 2 is a schematic diagram illustrating a comb-structured shielding layer according to a first embodiment of the disclosure.

FIG. 2 is a schematic diagram illustrating a comb-structured shielding layer according to a first embodiment of the disclosure. Referring to FIG. 2, the comb-structured shielding layer 12 may include a first area 121 and a second area 122. The second area is a comb-shaped area, and electrically coupled to ground through an electrical connection of the first area 121 and the ground (or a reference electrical potential level) of a wireless charging transmitter, in which the comb-structured shielding layer 12 is disposed. The second area 122 includes a plurality of parallel segments 122-1, 122-2, . . . , 122-n, where n is positive integers greater than 2. There are parallel spaces allocated between the parallel segments 122-1, 122-2, . . . , 122-n. Thus, the comb-structured shielding layer 12 may shield the E-field electromagnetic radiations from a wireless charging module close to the comb-structured shielding layer 12, while the comb-structured shielding layer 12 may be invisible to (or not shielding) the H-field electromagnetic radiations from the wireless charging module.

In the present embodiment, the grounded shielding of the first area 121 and the second area 122 may be printed on a printed circuit board (PCB) as a circuit path. The shielding of the first area 121 and the second area 122 are conductive materials such as metal. For example, in the present embodiment, the copper coating may be firstly applied on a PCB shown as a board 123; then parallel spaces between the segments of the second area 122 may be stripped off/peeled off/delaminated from the board 123 to form the comb-shaped shielding area. However, the present disclosure is not limited to PCB; and in other embodiment, any non-conductive material may be configured as the board of the shielding, a carrier of the shielding or a foil on which the grounded shielding of the first area 121 and the second area 122 may be printed on or disposed on.

Figure 3:
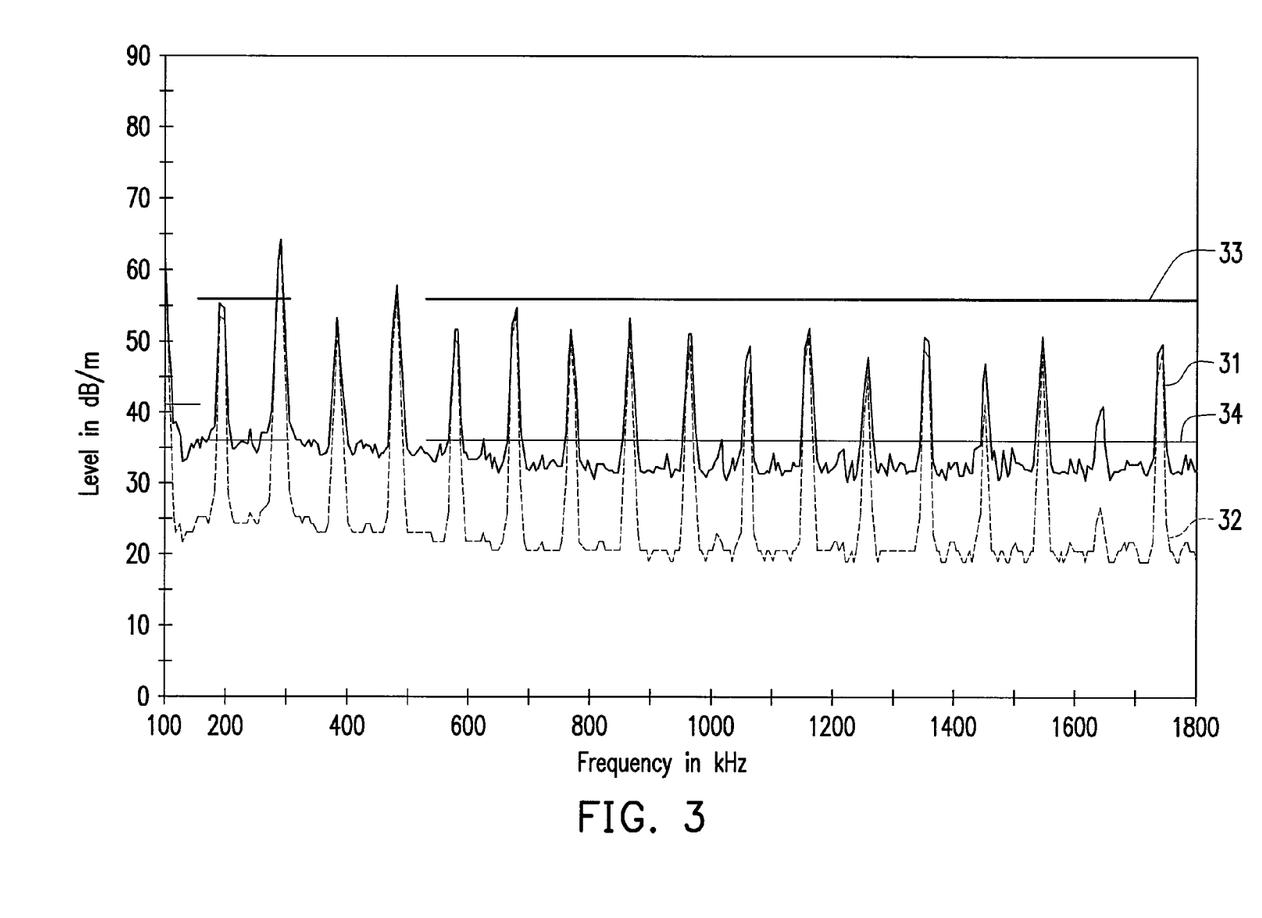
FIG. 3 is a schematic diagram illustrating measured electromagnetic radiation of an unshielded wireless charging transmitter.

FIG. 3 is a schematic diagram illustrating measured electromagnetic radiation of an unshielded wireless charging transmitter. Referring to FIG. 3, the schematic diagram shows an experiment measurement on electromagnetic radiations from the wireless charging module without shielding or without the comb-structured shielding layer. The measurement of electromagnetic radiations is conducted on a target electronic device placed on top of the unshielded wireless charging transmitter. The electric current of the wireless charging module is configured to be between 620 mA to 630 mA. The line 33 in FIG. 3 refers to a peak electromagnetic radiations threshold according to OEM's EMC and EMI specifications; the line 34 in FIG. 3 refers to an averaged electromagnetic radiations threshold according to OEM's EMC and EMI specifications. The line 31 refers to peak measured electromagnetic radiations; the line 32 refers to average measured electromagnetic radiations. According to observations on the lines 31, 32, 33 and 34, it may be concluded that the radiations from the wireless charging module is significant above the spectrum limit of OEM's EMC and EMI specifications in a board spectrum and thus not acceptable.

Figure 4:
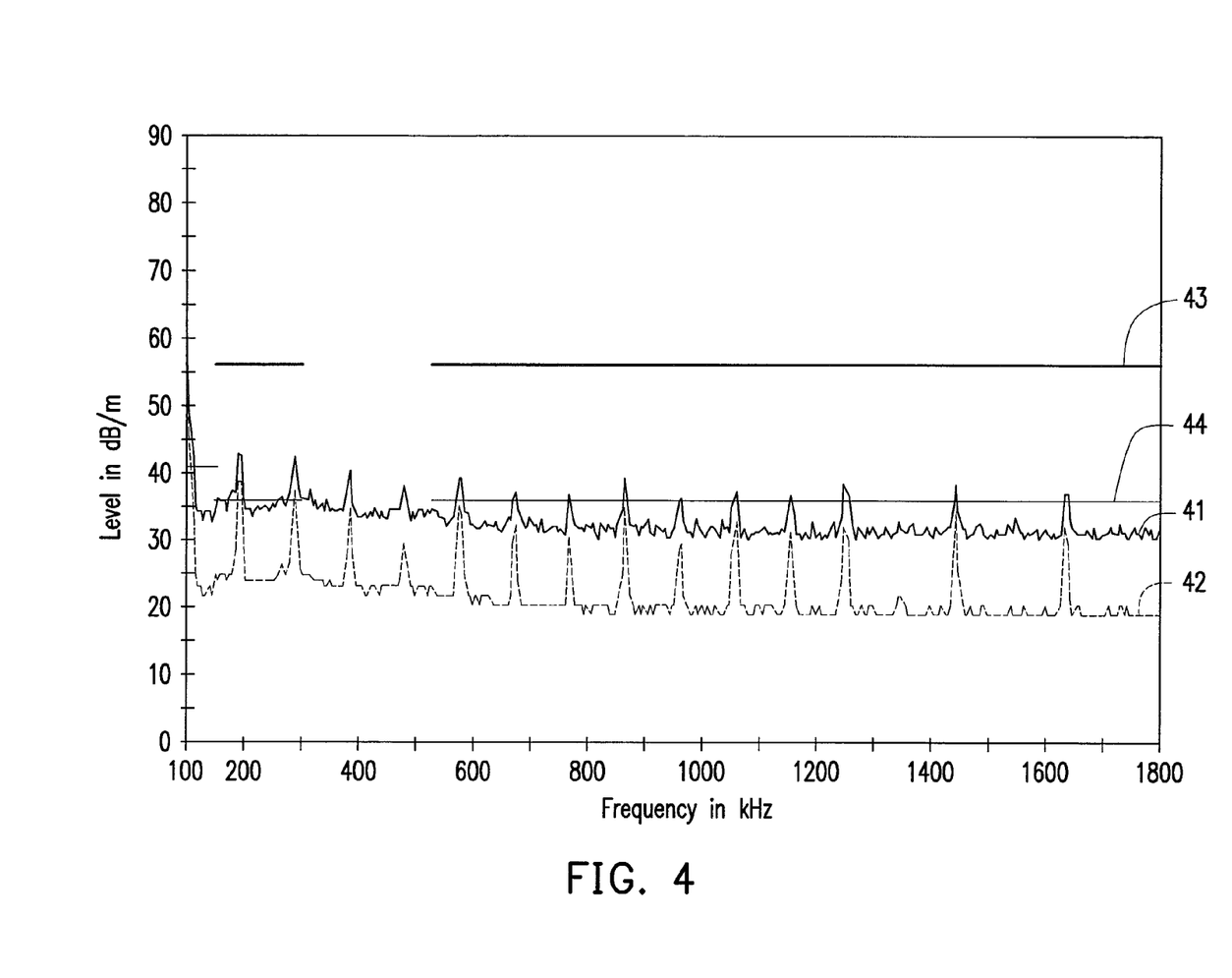
FIG. 4 is a schematic diagram illustrating measured electromagnetic radiation of a wireless charging transmitter with a comb-structured shielding layer according to an embodiment of the disclosure.

FIG. 4 is a schematic diagram illustrating measured electromagnetic radiation of a wireless charging transmitter with a comb-structured shielding layer according to an embodiment of the disclosure. Referring to FIG. 4, the schematic diagram shows an experiment measurement on electromagnetic radiations from the wireless charging module with shielding, and, particularly, the shielding being the comb-structured shielding layer such as those illustrated in FIGS. 1-2. The measurement of electromagnetic radiations is conducted on a target electronic device placed on top of the comb-structured shielding layer, which is disposed on top of the wireless charging module in the wireless charging transmitter. The electric current of the wireless charging module is configured to be between 640 mA to 650 mA. The line 43 in FIG. 4 refers to a peak electromagnetic radiations threshold according to OEM's EMC and EMI specifications; the line 44 in FIG. 4 refers to an averaged electromagnetic radiations threshold according to OEM's EMC and EMI specifications. The line 41 refers to peak measured electromagnetic radiations; the line 42 refers to average measured electromagnetic radiations. Based upon observations on the lines 41, 42, 43 and 44, it may be shown that the radiations from the wireless charging module is still within the spectrum limit of OEM's EMC and EMI specifications in a board spectrum and thus acceptable.

Figure 5:
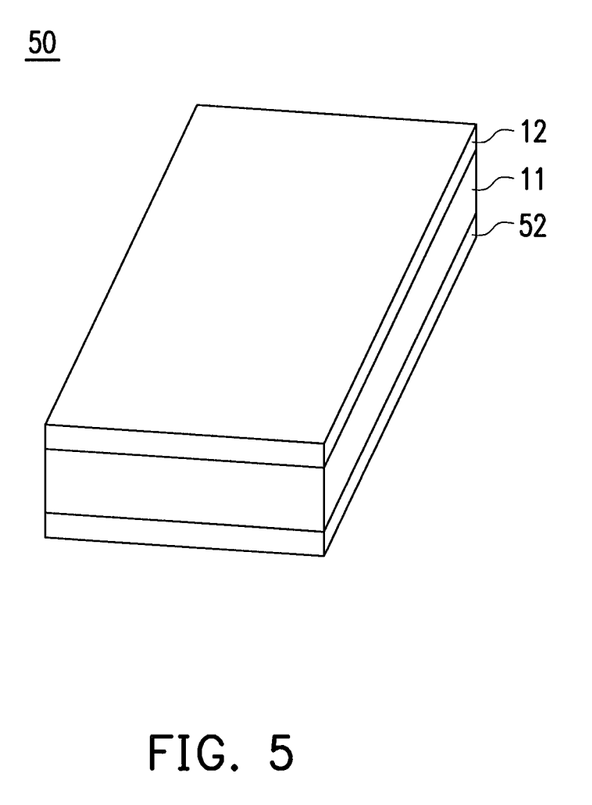
FIG. 5 is a schematic diagram illustrating a wireless charging transmitter with comb-structured shielding layers according to another embodiment of the disclosure.

FIG. 5 is a schematic diagram illustrating a wireless charging transmitter with comb-structured shielding layers according to another embodiment of the disclosure. Referring to FIG. 5, the wireless charging transmitter 50 may include a wireless charging module 11, which is disposed between two layers of comb-structured shielding layers 12 and 52. The comb-structured shielding layers 12 and 52 may be configured to provide shielding of E-field electromagnetic radiations from the wireless charging module 11.

Figure 6:
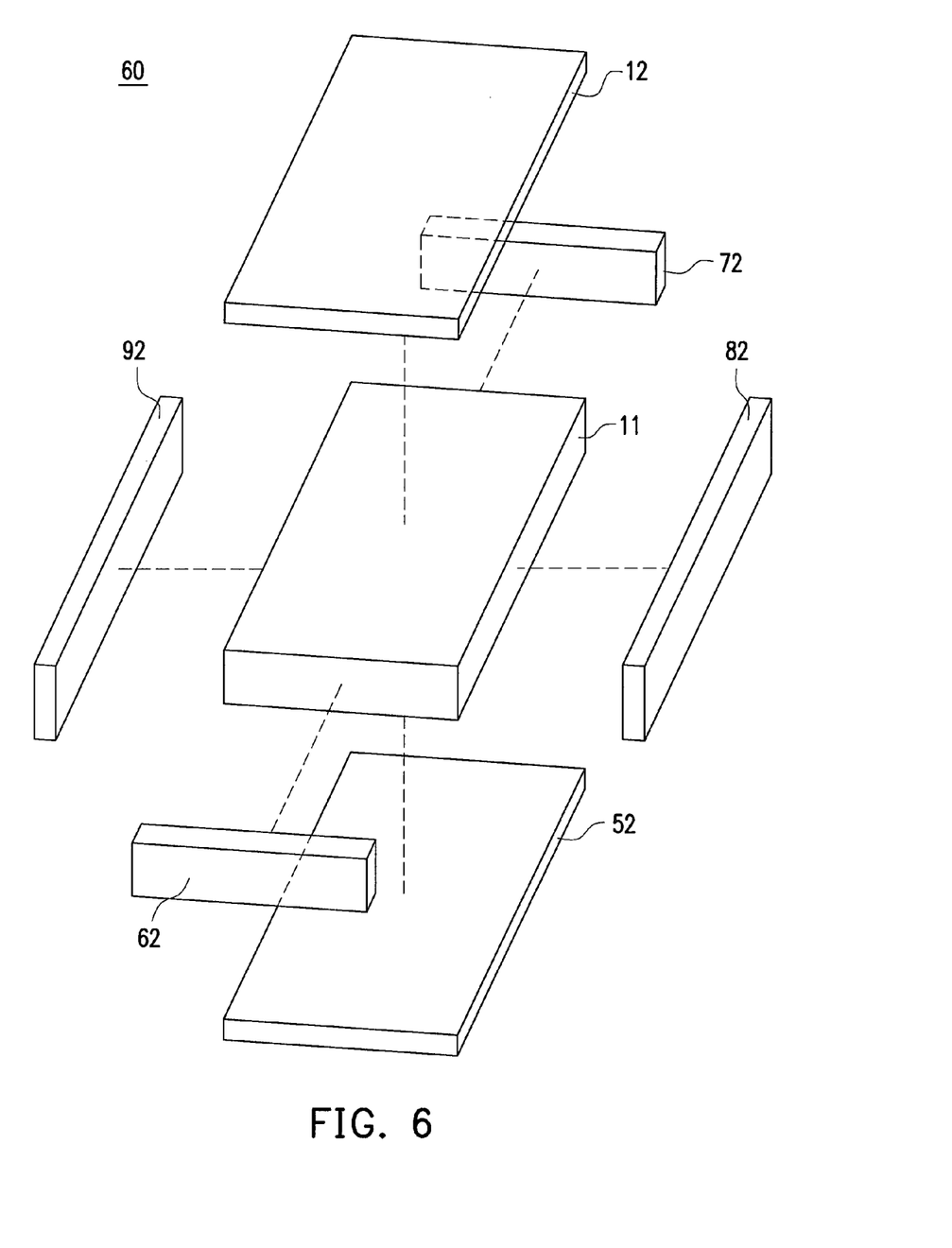
FIG. 6 is a schematic diagram illustrating a wireless charging transmitter with comb-structured shielding layers according to another embodiment of the disclosure.

FIG. 6 is a schematic diagram illustrating a wireless charging transmitter with comb-structured shielding layers according to another embodiment of the disclosure. Referring to FIG. 6, the wireless charging transmitter 50 may include a wireless charging module 11, which is disposed in a surrounding of six layers of comb-structured shielding layers 12, 52, 62, 72, 82 and 92. In other words, the comb-structured shielding layers 12, 52, 62, 72, 82 and 92 may be disposed respectively on six different sides of the wireless charging transmitter 50. Thus, the comb-structured shielding layers 12, 52, 62, 72, 82 and 92 are respectively configured to provide shielding of E-field electromagnetic radiations from the wireless charging module 11 in different reference directions. In practical implementations, a wireless charging transmitter may have any combination of the comb-structured shielding layers 12, 52, 62, 72, 82 and 92, where the combination of the comb-structured shielding layers may be a combination of two, three, four, five or six comb-structured shielding layers depending on practical design requirements.

Figure 7:
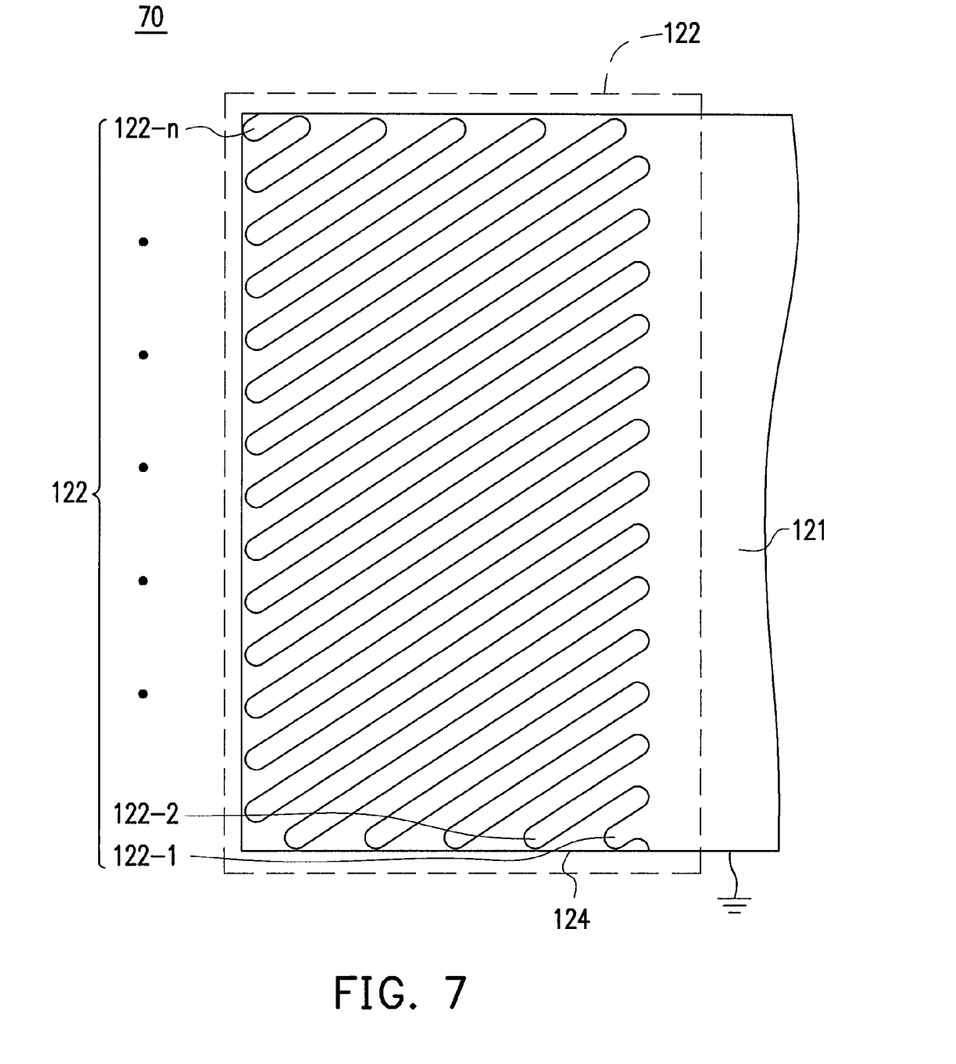
FIG. 7 is a schematic diagram illustrating a comb-structured shielding layer according to a second embodiment of the disclosure.

FIG. 7 is a schematic diagram illustrating a comb-structured shielding layer according to a second embodiment of the disclosure. Referring to FIG. 7, a comb-structured shielding layer 70 may include a first area 121 and a second area 122. Both of the first area 121 and the second area 122 are grounded. In comparison with the first embodiment, the second area 122 have a plurality of parallel segments 122-1, 122-2, . . . , 122-n; each of the parallel segments 122-1, 122-2, . . . , 122-n has an inclined angle between itself and an edge reference line 124 of the comb-structured shielding layer 70. It is noted that, in a wireless charging operation, the wireless charging coil or coil structure is allocated to be completely covered by the second area 122, and the comb-structured shielding layer 70 is disposed between the wireless charging coil or coil structure and the target electronic device which is to be wirelessly charged.

Figure 8:
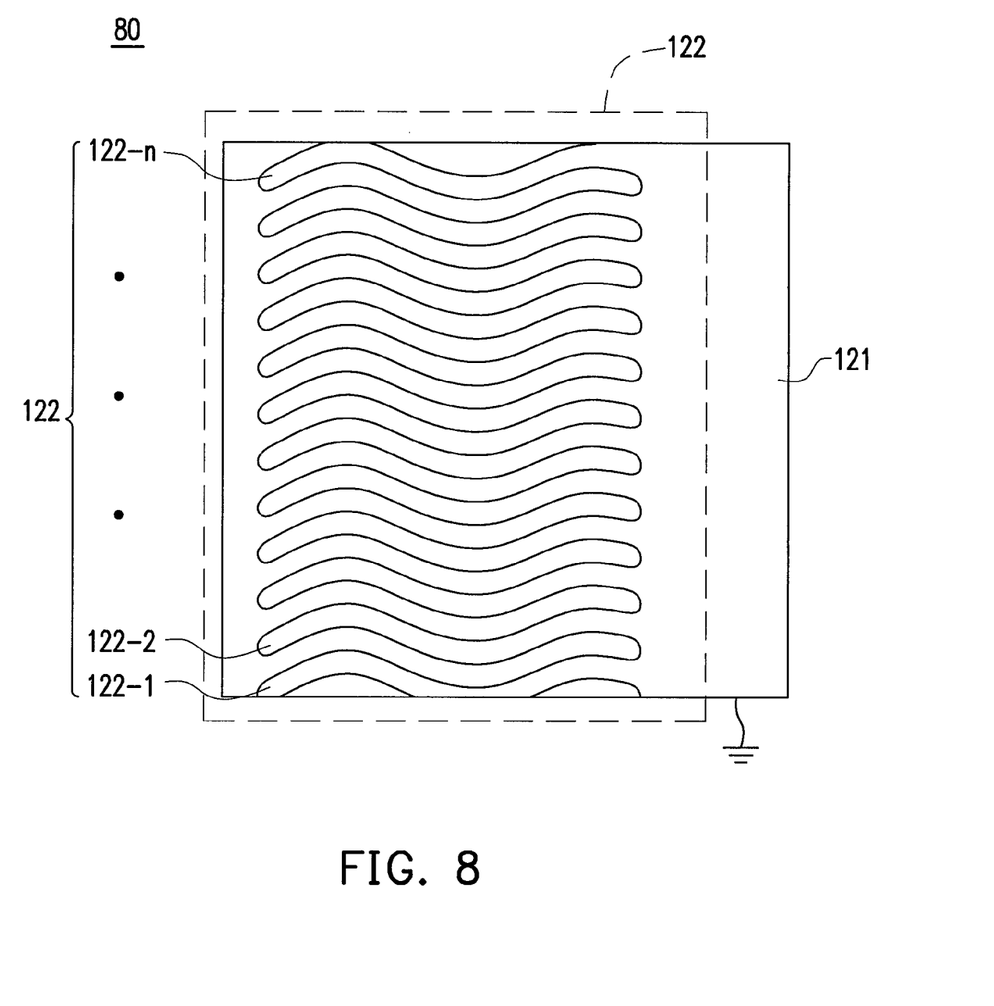
FIG. 8 is a schematic diagram illustrating a comb-structured shielding layer according to a third embodiment of the disclosure.

FIG. 8 is a schematic diagram illustrating a comb-structured shielding layer according to a third embodiment of the disclosure. Referring to FIG. 8, a comb-structured shielding layer 80 may include a first area 121 and a second area 122. Both of the first area 121 and the second area 122 are grounded. In comparison with the first embodiment, the second area 122 have a plurality of parallel segments 122-1, 122-2, . . . , 122-n; each of the parallel segments 122-1, 122-2, . . . , 122-n have a corrugated shape but they do not cross each other. It is noted that, in a wireless charging operation, the wireless charging coil or coil structure is allocated to be completely covered by the second area 122, and the comb-structured shielding layer 80 is disposed between the wireless charging coil or coil structure and the target electronic device which is to be wirelessly charged.

Figure 9:
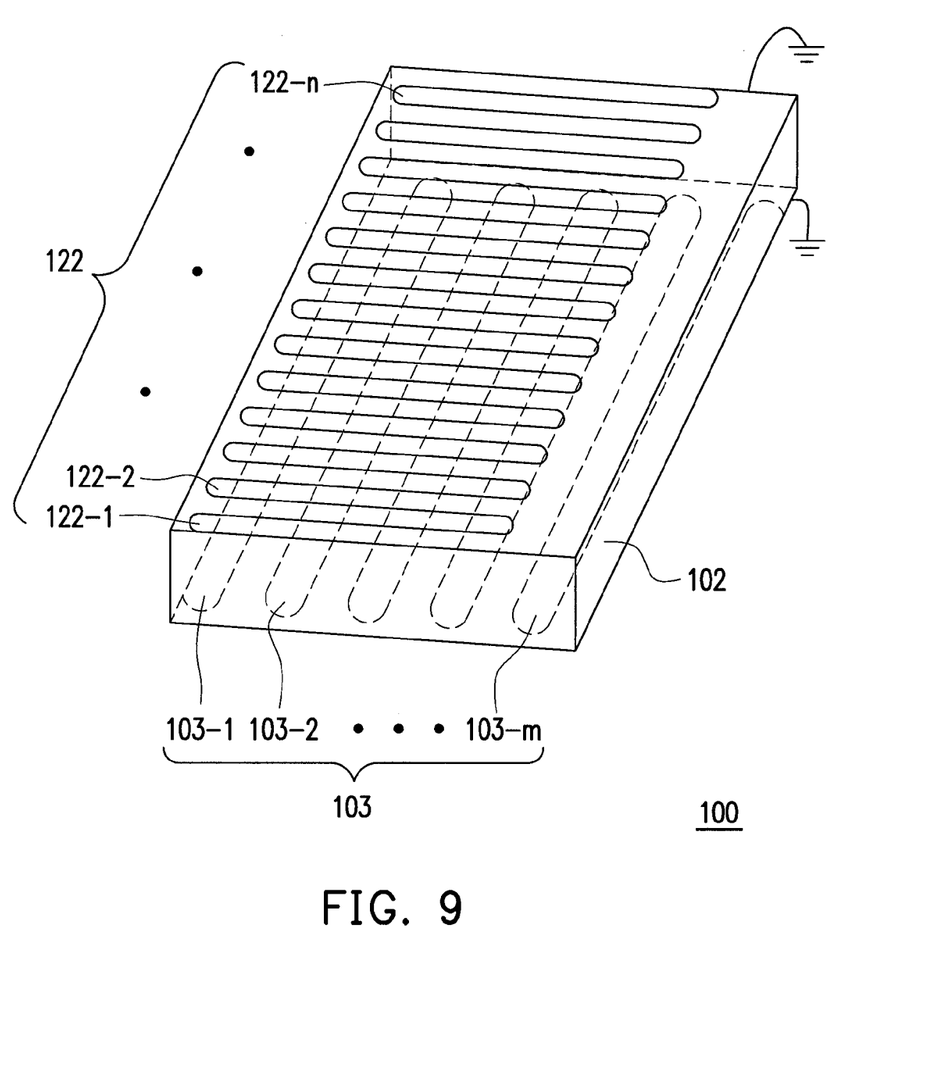
FIG. 9 is a schematic diagram illustrating a comb-structured shielding layer according to a fourth embodiment of the disclosure.

FIG. 9 is a schematic diagram illustrating a comb-structured shielding layer according to a fourth embodiment of the disclosure. Referring to FIG. 9, a comb-structured shielding layer 100 may include a first shielding layer 101 and a second shielding layer 103 disposed between a non-conductive layer 102. Both of the first shielding layer 101 and the second shielding layer 103 are grounded. The first shielding layer 101 have a plurality of parallel segments 101-1, 101-2, . . . , 101-n with parallel spaces allocated between the parallel segments 101-1, 101-2, . . . , 101-n. Similarly but not identically, the second shielding layer 103 have a plurality of parallel segments 103-1, 103-2, . . . , 103-m with parallel spaces allocated between the parallel segments 103-1, 103-2, . . . , 103-m but the parallel segments 103-1, 103-2, . . . , 103-m are allocated in a first orientation orthogonal to a second orientation of the parallel segments 101-1, 101-2, . . . , 101-n, where m is a positive integer greater than 2 and m may be different from n. In a wireless charging operation, the comb-structured shielding layer 100 is allocated on the top of the wireless charging module as the shielding layer 12 shown in FIG. 1.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A comb-structured shielding layer, disposed between a wireless charging module and a target electronic device and completely covering the wireless charging module, comprising:
    a first area, electrically connected to a reference electric potential; and
    a second area, electrically connected to the reference electric potential through the first area, being a comb-shape area, configured to shield E-field electromagnetic radiations but allow magnetic H-field electromagnetic radiations associated with the E-field electromagnetic radiations pass through the comb-structured shielding layer.

2. The comb-structured shielding layer of claim 1, wherein the first area and the second area are both printed on a non-conductive material board.

3. The comb-structured shielding layer of claim 1, wherein the first area and the second area are both conductive materials.

4. The comb-structured shielding layer of claim 1, wherein the comb-shape area of the second area is configured with a plurality of parallel segments, and the parallel segments are spaced by non-conductive materials.

5. The comb-structured shielding layer of claim 4, wherein each one of the parallel segments is configured with an inclined angle between a reference line of the comb-structured shielding layer and the each one of the parallel segments.

6. The comb-structured shielding layer of claim 4, wherein each one of the parallel segments is configured with a corrugated shape but the parallel segments do not cross any other parallel segments.

7. A wireless charging transmitter, comprising:
    a wireless charging module, connected to an external power source, having at least one wireless charging coil, configured to convert alternative current power from the external power source to magnetic H-field electromagnetic radiations, and wirelessly charges a target electronic device; and
    at least one comb-structured shielding layer, disposed between the wireless charging module and the target electronic device and completely covering the wireless charging module, configured to allow the magnetic H-field electromagnetic radiations pass through the at least one comb-structured shielding layer.

8. The wireless charging transmitter of claim 7, wherein the at least one comb-structured shielding layer is configured to shield the target electronic device from E-field electromagnetic radiations associated with the magnetic H-field electromagnetic radiations.

9. The wireless charging transmitter of claim 7, wherein each one of the at least one comb-structured shielding layer comprises:
    a first area, electrically connected to a reference electric potential; and
    a second area, electrically connected to the reference electric potential through the first area, being a comb-shape area, configured to shield the E-field electromagnetic radiations but allow the magnetic H-field electromagnetic radiations pass through the comb-structured shielding layer.

10. The wireless charging transmitter of claim 9, wherein the first area and a second area are both printed on a non-conductive material board.

11. The wireless charging transmitter of claim 9, wherein the first area and the second area are both conductive materials.

12. The wireless charging transmitter of claim 9, wherein the comb-shape area of the second area is configured with a plurality of parallel segments, and the parallel segments are spaced by non-conductive materials.

13. The wireless charging transmitter of claim 12, wherein each one of the parallel segments are configured with an inclined angle between a reference line of the comb-structured shielding layer and the each one of the parallel segments.

14. The wireless charging transmitter of claim 12, wherein each one of the parallel segments is configured with a corrugated shape but the parallel segments do not cross any other parallel segments.

15. The wireless charging transmitter of claim 12, wherein the comb-structured shielding layer includes a first comb-structured shielding layer and a second comb-structured shielding layer disposed between a non-conductive layer, and a first orientation of the parallel segments on first comb-structured shielding layer and a second orientation of the parallel segments on second comb-structured shielding layer are orthogonal to each other.

* * * * *